(12) United States Patent
McDowell (10) Patent No.: US 8,067,938 B2
(45) Date of Patent: Nov. 29, 2011

(54) MICROCOIL NMR DETECTORS

(75) Inventor: Andrew F. McDowell, Albuquerque, NM (US)

(73) Assignee: ABQMR, Inc., Albuquerque, MN (US)

( * ) Notice: Subject to any disclaimer, the term of this patent is extended or adjusted under 35 U.S.C. 154(b) by 387 days.

(21) Appl. No.: 12/114,538

(22) Filed: May 2, 2008

(65) Prior Publication Data

US 2008/0272788 A1    Nov. 6, 2008

Related U.S. Application Data (60) Provisional application No. 60/927,456, filed on May 3, 2007.

(51) Int. Cl.
*G01V 3/00* (2006.01)
(52) U.S. Cl. .................................. 324/318; 324/309
(58) Field of Classification Search .......... 324/300–345; 600/407–445
See application file for complete search history.

(56) References Cited

U.S. PATENT DOCUMENTS

| | | | |
|---|---|---|---|
| 4,901,018 A | 2/1990 | Lew | |
| 5,338,687 A | 8/1994 | Lee et al. | |
| 5,654,636 A | 8/1997 | Sweedler et al. | |
| 5,684,401 A * | 11/1997 | Peck et al. | 324/318 |
| 5,768,089 A | 6/1998 | Finnigan | |
| 6,097,188 A | 8/2000 | Sweedler et al. | |
| 6,194,900 B1 | 2/2001 | Freeman et al. | |
| 6,236,205 B1 | 5/2001 | Ludeke et al. | |
| 6,242,915 B1 | 6/2001 | Hurd | |
| 6,307,372 B1 | 10/2001 | Sugerman et al. | |
| 6,326,787 B1 | 12/2001 | Cowgill | |
| 6,397,094 B1 | 5/2002 | Ludeke et al. | |
| 6,456,072 B1 | 9/2002 | Webb et al. | |
| 6,487,437 B1 | 11/2002 | Viswanathan et al. | |
| 6,512,941 B1 * | 1/2003 | Weiss et al. | 600/410 |
| 6,587,706 B1 | 7/2003 | Viswanathan | |
| 6,594,517 B1 | 7/2003 | Nevo | |
| 6,696,838 B2 * | 2/2004 | Raftery et al. | 324/321 |
| 6,788,061 B1 | 9/2004 | Sweedler et al. | |
| 6,822,454 B2 | 11/2004 | Peck et al. | |
| 6,845,262 B2 | 1/2005 | Albert et al. | |
| 6,958,609 B2 * | 10/2005 | Raftery et al. | 324/321 |
| 7,141,978 B2 * | 11/2006 | Peck et al. | 324/321 |
| 7,200,430 B2 * | 4/2007 | Thomas et al. | 600/410 |
| 7,202,667 B2 | 4/2007 | Barbic | |
| 7,271,592 B1 | 9/2007 | Gerald, II et al. | |
| 7,274,191 B2 | 9/2007 | Park et al. | |
| 7,345,479 B2 | 3/2008 | Park et al. | |
| 7,403,008 B2 | 7/2008 | Blank et al. | |

(Continued)

FOREIGN PATENT DOCUMENTS

CA    2342047 A1    9/2001

(Continued)

OTHER PUBLICATIONS

Nilan Wu et al 1H-NMR spectroscopy on the Nanoliter Scal for Static and On-line Measurements.: Anal. Chem. 1994, 66, 38-49-3857.*

(Continued)

*Primary Examiner* — Brij Shrivastav
(74) *Attorney, Agent, or Firm* — Thomas Meyers; Adam Schoen; Brown Rudnick LLP (57) ABSTRACT

The present invention provides resonance circuits, detection devices incorporating such circuits, and methods for their design, construction, and use.

4 Claims, 5 Drawing Sheets

U.S. PATENT DOCUMENTS

| | | | |
|---|---|---|---|
| 7,405,567 B2* | 7/2008 | McDowell | 324/318 |
| 7,564,245 B2 | 7/2009 | Lee | |
| 2002/0130661 A1 | 9/2002 | Raftery et al. | |
| 2003/0088181 A1 | 5/2003 | Gleich | |
| 2003/0092029 A1 | 5/2003 | Josephson et al. | |
| 2003/0222648 A1 | 12/2003 | Fan | |
| 2004/0018611 A1 | 1/2004 | Ward et al. | |
| 2005/0245814 A1 | 11/2005 | Anderson et al. | |
| 2007/0090836 A1 | 4/2007 | Xiang et al. | |
| 2007/0116602 A1 | 5/2007 | Lee | |
| 2007/0152669 A1 | 7/2007 | Park et al. | |
| 2007/0152670 A1 | 7/2007 | Park et al. | |
| 2008/0204022 A1* | 8/2008 | Sillerud et al. | 324/318 |
| 2008/0315875 A1 | 12/2008 | Sillerud | |
| 2009/0146658 A1* | 6/2009 | McDowell et al. | 324/309 |
| 2009/0256572 A1 | 10/2009 | McDowell | |

FOREIGN PATENT DOCUMENTS

| | | |
|---|---|---|
| EP | 1304581 A2 | 10/2002 |
| WO | WO 01/73460 A1 | 10/2001 |
| WO | WO 02/098364 | 12/2002 |
| WO | WO 2005/026762 | 3/2005 |
| WO | WO 2008/119054 | 10/2008 |

OTHER PUBLICATIONS

Peck et al: Design and Analysis of Microcoils for NMR Microscopy: Journal of Magnetic Resonance Series B, 1995,108, 114-124.*

Abragam, "Principles of Nuclear Magnetism," *Clarendon Press*, Oxford, 1961, pp. 71-83.

Fukushima, et al., "Experimental Pulse NMR; A Nutes and Bolts Approach," *Addison-Wesley Publ. Co.*, MA, 1981, pp. 311, 342, 374.

Goloshevsky, A.G., et al. "Development of Low Field Nuclear Magnetic Resonance Microcoils," *Rev. Sci. Inst.*, vol. 76, 2005, pp. 024101-1 through 024101-6.

Hoult et al., "The Signal-to-Noise Ratio of the Nuclear Magnetic Resonance Experiment," *J. Magn. Reson.*, vol. 24,1976, pp. 71-85.

Kaittanis et al., One-Step, Nanoparticle-Mediated Bacterial Detection with Magnetic Relaxation,: *Nano Letters*, vol. 7, No. 2, 2007, pp. 381-383.

List of Claims for International Application No. PCT/US2008/058518 filed Mar. 27, 2008, 8 pages.

Listing of Claims for International Application No. PCT/US2008/080983, filed Oct. 23, 2008, 8 pages.

Listing of Claims for International Application No. PCT/US2009/067577 filed Dec. 10, 2009, 14 pages.

Massin et al., "Planar Microcoil-Based Magnetic Resonance Imaging of Cells," *Transducers '03, The 12th International Conference on Solid State Sensors, Actuators and Microsystems*, Boston, Jun. 8-12, 2003, pp. 967-970.

McDowell et al., "Low-Field Micro-Coil Probe Development for Portable NMR," 8th ICMRM, The Heidelberg Conference, Mibu, Japan, Aug. 22-26, 2005, 14 pages. (pp. 2-14 are a magnification of p. 1).

McDowell et al., "Low-Field Micro-Coil Probe Development for Portable NMR," 8th ICMRM, The Heidelberg Conference, Mibu, Japan, Conference Program Abstract, Aug. 22-26, 2005, 1 page.

Minard et al., "Solenoidal Microcoil Design, Part 1: Optimizing rf Homogeneity," *Concepts in Magn. Reson.*, vol. 13, 2001, pp. 128-142.

Moresi, G., et al., Miniature Permanent Magnet for Table-Top NMR, *Concept. Magn. Reson.*, V. 19B, 2003, pp. 35-43.

Notification of Transmittal of the International Search Report and the Written Opinion of the International Searching Authority, or the Declaraiton for ABQMR, Inc., International Application No. PCT/US2008/058518, mailed Jul. 7, 2008, 21 pages.

Notification of Transmittal of the International Search Report and the Written Opinion of the International Search Authority, or the Declaration, International Application No. PCT/US2008/080983, mailed Mar. 3, 2009, 20 pages.

Notification of Transmittal of the International Search Report and the Written Opinion of the International Searching Authority, or the Declaration for International Application No. PCT/US2009/067577 mailed Feb. 5, 2010, 13 pages.

Peck et al., "Design and Analysis of Microcoils for NMR Microscopy," *J. Magn. Reson.*, vol. 108, 1995, pp. 114-124.

Peck et al., "RF Microcoils Patterned Using Microlithographic Techniques for Use as Microsensors in NMR," *Engineering in Medicine and Biology Society*, Proceedings of the 15th Annual International Conference of the IEEE Oct. 28-31, 1993, pp. 174-175.

Seeber et al., "Triaxial Magnetic Field Gradient System for Microcoil Magnetic Resonance Imaging," *Review of Scientific Instruments*, vol. 71, No. 11, Nov. 2000, pp. 4263-4272.

Sorli et al., "Micro-Spectrometer for NMR: Analysis of Small Quantities in Vitro," *Mes. Sci. Technol.*, vol. 15, 2004, pp. 877-880.

Taktak et al., Multiparameter Magnetic Relaxation Switch Assays, *Analytical Chemistry*, vol. 79, No. 23, Dec. 1, 2007, pp. 8863-8869.

U.S. Appl. No. 12/720,541 entitled "Tuning Low-Inductance Coils at Low Frequencies," filed Mar. 9, 2010, 39 pages.

U.S. Appl. No. 12/635,583 entitled "Nuclear Magnetic Resonance Apparatus, Methods and Associated Technology," filed Dec. 10, 2009, 66 pages.

U.S. Appl. No. 12/720,499 entitled "Biological Detector and Method," filed Mar. 9, 2010, 43 pages.

U.S. Appl. No. 60/981,948, filed Oct. 23, 2007, 35 pages.
U.S. Appl. No. 61/099,975, filed Sep. 25, 2008, 87 pages.
U.S. Appl. No. 61/121,416, filed Dec. 10, 2008, 5 pages.
U.S. Appl. No. 60/839,006, filed Aug. 21, 2006, 15 pages.
U.S. Appl. No. 60/920,165, filed Mar. 27, 2007, 16 pages.

Van Bentum et al., "Towards Nuclear Magnetic Resonance µ-Spectroscopy and µ-Imaging," *Analyst, Royal Society of Chemistry*, London, vol. 129, No. 9, Jan. 1, 2004, pp. 793-803.

U.S. Appl. No. 60/927,456, filed May 3, 2007, 25 pages.

Notification of Transmittal of the International Search Report and the Written Opinion of the International Search Authority, or the Declaration, International Application No. PCT/US/2008/062473, mailed Oct. 29, 2008, 23 pages.

Listing of Claims for International Application No. PCT/US/2008/062473, filed May 2, 2008, 4 pages.

Sillerud et al., "1H NMR Detection or Superparamagnetic Nanoparticles at 1T Using a Microcoil and Novel Tuning Circuit," *Journal of Magnetic Resonance, Academic Press*, Orlando, Florida, Aug. 1, 2006, pp. 181-190.

Subramanian et al., "RF Microcoil Design for Practical NMR of Mass-Limited Samples," *Journal of Magnetic Resonance, Academic Press*, Orlando, Florida, vol. 133, No. 1, Jul. 1, 1998, pp. 227-231.

Armenean et al., "NMR Radiofrequency Microcoil Design: Electromagnetic Simulation Usefulness," *Compes Rendus—Biologies, Elsevier*, Paris, vol. 325, No. 4, Apr. 1, 2002, pp. 457-463.

Magin et al., "Miniature Magnetic Resonance Machines," *IEEE Spectrum, IEEE Inc.* New York, vol. 34, No. 10, Oct. 1, 1997, pp. 51-61.

Armenean et al., "Solenoidal and Planar Microcoils for NMR Spectroscopy," *Proceedings of the 25th Annual International Conference of the IEEE Engineering in Medicine and Biology Society*, Cancun, Mexico, Sep. 17, 2003, pp. 3045-3048.

McDowell et al., "Operating Nanoliter Scale NMR Microcoils in a 1tesla Field," *Journal of Magnetic Resonance, Academic Press*, Orlando, Florida, vol. 188, No. 1, Sep. 1, 2007, pp. 74-82.

Seeber et al., "Design and Testing of High Sensitivity Microreceiver Coil Apparatus for Nuclear Magnetic Resonance and Imaging," *Review of Scientific Instructions, AIP*, Melville, NY, Vo. 72, No. 4, Apr. 1, 2001, pp. 2171-2179.

* cited by examiner

MICROCOIL NMR DETECTORS

CROSS REFERENCE

This application claims priority to U.S. Provisional Patent Application Ser. No. 60/927,456 filed May 3, 2007, incorporated by reference herein in its entirety.

FIELD OF THE INVENTION

The present invention relates generally to nuclear magnetic resonance, detection devices, and uses thereof.

BACKGROUND

A variety of experiments in Nuclear Magnetic Resonance (NMR) could benefit from miniaturization of the detector coil. When samples are mass-limited, reducing the detection volume to match the sample size offers enhanced Signal-to-Noise-Ratio (SNR) performance. To date, efforts made to perfect high-resolution spectroscopy in very small coils have not been suitably effective [1-9], particularly in developing portable detection devices. The integration of NMR with separation techniques such as chromatography (e.g., [10]) or capillary electrophoresis [11,12] proceeds more naturally when the NMR detection volume can be made compatible with the very small sample volumes and fluid handling tubing typical of the separation step. Researchers have also sought the integration of NMR with microfluidic lab-on-a-chip devices, in which case the NMR detector coil is often formed in a lithographic-type process [13,14]. Very small coils have also been recognized as potential platforms for studying or imaging extremely small objects, even single cells [15-19]. All of the above applications have typically been implemented on traditional, high-field superconducting NMR magnets. These magnets provide the best route toward maximal SNR performance, have very stable and homogeneous fields, and are readily available in most NMR research groups.

A fully miniaturized NMR device would be based on a very small permanent magnet. Modern permanent magnet designs result in compact, lightweight devices operating at fields of 1-2 Tesla [24]. Although higher fields could be attained in a small superconducting magnet, the fragility and high maintenance needs of that magnet technology make it unattractive for portable or industrial applications. However, the low field of the permanent magnet presents a number challenges. First, the signal to noise ratio (SNR) in NMR is usually proportional to $\omega_0^{7/4} = (\gamma B_0)^{7/4}$, where $\omega_0$ is the NMR frequency and $B_0$ is the field strength [25]. SNR is already at a premium for micro-scale sample volumes, so detector circuits and electronics must be optimally efficient. At low frequencies, the electrical skin depth is no longer small compared to wire diameters, a regime in which optimal NMR SNR performance has not been explored experimentally, to our knowledge. More subtly, a low field and correspondingly low NMR frequency makes it difficult to construct an electrically resonant LC probe circuit from the very-low-inductance sample coil. We have recently proposed and implemented [26] a solution to this problem that introduces a large, fixed-value, auxiliary inductor to eliminate the need for a very large tuning capacitance, which would be awkward to use and would be inconsistent with the design goals of a practical compact system. Understanding and meeting the particular challenges of operating very small NMR detector coils in low-field permanent magnets is a crucial step toward the realization of very small, simple, and inexpensive NMR systems that are capable enough to enable new applications.

While some progress has been made in developing such portable microcoil-based NMR systems [26], improved devices that provide improved SNR, line width performance, and other benefits would be of great value to the art. Such improvements not only will greatly improve detection capabilities, but also would allow further reductions in sample volume and further miniaturization of the device.

SUMMARY OF THE INVENTION

In a first aspect, the present invention provides a resonant circuit comprising
  (a) a closely wound microcoil, wherein the closely wound microcoil is an effective magnetic resonance transmitter or receiver coil;
  (b) an auxiliary inductor coil electrically connected in series to the closely wound microcoil; and
  (c) a tuning capacitor electrically connected to the closely wound microcoil and the auxiliary inductor coil to form a resonant circuit.

In a second aspect, the present invention provides a resonant circuit comprising
  (a) a microcoil comprising wire with a diameter less than or equal to 2.5 times a skin-depth of the wire material, wherein the microcoil is an effective magnetic resonance transmitter or receiver coil;
  (b) an auxiliary inductor coil electrically connected in series to the microcoil; and
  (c) a tuning capacitor electrically connected to the microcoil and the auxiliary inductor coil to form a resonant circuit.

In a third aspect, the present invention provides a detection device, comprising:
  (a) a permanent magnet possessing a field strength of 1-2 Tesla; and
  (b) a resonant circuit comprising:
    (i) a closely wound microcoil, wherein the closely wound microcoil is disposed proximate to the magnetic field generated by the permanent magnet, and wherein the closely wound microcoil is an effective magnetic resonance transmitter or receiver coil;
    (ii) an auxiliary inductor coil electrically connected in series to the closely wound microcoil; and
    (iii) a tuning capacitor electrically connected to the closely wound microcoil and the auxiliary inductor coil to form a resonant circuit; and
  (c) a capillary with an inner diameter of between 100 μm and 400 μm, wherein the closely wound microcoil is wound around the capillary.

In a fourth aspect, the present invention provides a detection device, comprising:
  (a) a permanent magnet possessing a field strength of 1-2 Tesla; and
  (b) a resonant circuit comprising:
    (i) a microcoil comprising wire with a diameter less than or equal to 2.5 times a skin-depth of the wire material, wherein the microcoil is disposed proximate to the magnetic field generated by the permanent magnet, and wherein the microcoil is an effective magnetic resonance transmitter or receiver coil;
    (ii) an auxiliary inductor coil electrically connected in series to the microcoil; and
    (iii) a tuning capacitor electrically connected to the microcoil and the auxiliary inductor coil to form a resonant circuit; and (c) a capillary with an inner diameter of between 100 μm and 400 μm, wherein the microcoil is wound around the capillary.

In a fifth aspect, the present invention provides methods for detection comprising:

(a) delivering a sample fluid to a detection system of the third or fourth aspects of the invention;

(b) resonating the resonant circuit at low frequency; and (c) detecting resonance signals from the sample, wherein the resonance signals correlate with a presence of one or more targets of interest in the sample fluid.

In a sixth aspect, the present invention provides methods for designing an auxiliary tuning inductor for use in an NMR microcoil resonant circuit, comprising:

(a) preparing a microcoil with wire of a first diameter;

(b) determining an RF resistance of the microcoil;

(c) winding an auxiliary inductor coil with wire of a second diameter, where the second diameter is greater than the first diameter, and wherein a radius of the auxiliary inductor coil is determined using the formula:

$$r_{coil} = \sqrt{\frac{25 l_{wire} k d_{wire}}{46\pi}}$$

where $l_{wire}$ is the wire length, $d_{wire}$ is the wire diameter, and $kd_{wire}$ is the turn-to-turn wire spacing.

In a seventh aspect, the present invention provides methods for forming a closely wound microcoil, comprising:

(a) mounting a microcapillary tube to a headstock of a miniature lathe via an optical fiber chuck appropriately sized to hold a microcapillary tube;

(b) attaching a first end of a wire to the optical fiber chuck;

(c) attaching a second end of the wire to a support controlled by a saddle and cross-feed of the miniature lathe; and (d) turning the headstock and repositioning the cross-feed of the lathe until close winding of the microcoil around the microcapillary tube is complete.

DETAILED DESCRIPTION OF THE INVENTION

All publications, patents and patent applications cited herein are hereby expressly incorporated by reference for all purposes.

In a first aspect, the present invention provides a resonant circuit comprising (a) a closely wound microcoil, wherein the closely wound microcoil is an effective magnetic resonance transmitter or receiver coil;

(b) an auxiliary inductor coil electrically connected in series to the closely wound microcoil; and (c) a tuning capacitor electrically connected to the closely wound microcoil and the auxiliary inductor coil to form a resonant circuit.

In one embodiment, the closely wound microcoil comprises wire with a diameter less than or equal to 2.5 times a skin-depth of the wire material.

In a second aspect, the present invention provides a resonant circuit comprising (a) a microcoil comprising wire with a diameter less than or equal to 2.5 times a skin-depth of the wire material, wherein the microcoil is an effective magnetic resonance transmitter or receiver coil;

(b) an auxiliary inductor coil electrically connected in series to the microcoil; and (c) a tuning capacitor electrically connected to the microcoil and the auxiliary inductor coil to form a resonant circuit.

Resonant circuits of all aspects and embodiments of the present invention allow for the design and production of improved microcoil NMR devices that provide, for example, improved SNR and line width performance as described in detail below, and thus greatly improve detection capabilities, and also allow further reductions in sample volume and further miniaturization of microcoil NMR devices than was possible in prior methods and devices.

In one embodiment of this second aspect, the microcoil is a closely wound microcoil. In one embodiment of the resonant circuits of the first and second aspects of the invention, the microcoil or closely wound microcoil has a total length of between 148 μm and 648 μm. In another embodiment of the resonant circuits of the first and second aspects of the invention, the microcoil or closely wound microcoil is wound around a capillary with an outer diameter of between 170 and 550 μm, and/or an inner diameter of between 100 μm and 400 μm. In a further embodiment of the resonant circuits of the first and second aspects of the invention, the auxiliary inductor comprises wire of a larger diameter than a diameter of the microcoil or closely wound microcoil wire. In a still further embodiment of the resonant circuits of the first and second aspects of the invention, the auxiliary inductor coil has a radius of 0.3 cm to 0.6 cm. In another embodiment of the resonant circuits of the first and second aspects of the invention, the resonant circuits are mounted on a mechanical support; when mounted on a mechanical support, the resonant circuit may be installed in one or more shielded probe bodies. In one embodiment, the one or more shielded probe bodies comprise two shielded probe bodies, wherein a first shielded probe body shields the closely wound microcoil, wherein a second shielded body shields the shielded probe body shields the auxiliary inductor and the capacitor. Each of these embodiments can be used in combination with other embodiments of the first and second aspects of the invention, as well as further aspects of the invention that involve use of the resonant circuits of the first and second aspects. Details of each of these embodiments are provided in the examples below.

In a third aspect, the present invention provides a detection device, comprising:
 (a) a permanent magnet possessing a field strength of 1-2 Tesla; and
 (b) a resonant circuit comprising:
  (i) a closely wound microcoil, wherein the closely wound microcoil is disposed proximate to the magnetic field generated by the permanent magnet, and wherein the closely wound microcoil is an effective magnetic resonance transmitter or receiver coil;
  (ii) an auxiliary inductor coil electrically connected in series to the closely wound microcoil; and
  (iii) a tuning capacitor electrically connected to the closely wound microcoil and the auxiliary inductor coil to form a resonant circuit; and
 (c) a capillary with an inner diameter of between 100 μm and 400 μm, wherein the closely wound microcoil is wound around the capillary.

In a fourth aspect, the present invention provides a detection device, comprising:
 (a) a permanent magnet possessing a field strength of 1-2 Tesla; and
 (b) a resonant circuit comprising:
  (i) a microcoil comprising wire with a diameter less than or equal to 2.5 times a skin-depth of the wire material, wherein the microcoil is disposed proximate to the magnetic field generated by the permanent magnet, and wherein the microcoil is an effective magnetic resonance transmitter or receiver coil;
  (ii) an auxiliary inductor coil electrically connected in series to the microcoil; and
  (iii) a tuning capacitor electrically connected to the microcoil and the auxiliary inductor coil to form a resonant circuit; and
 (c) a capillary with an inner diameter of between 100 μm and 400 μm, wherein the microcoil is wound around the capillary.

The detection devices of the third and fourth aspects of the invention incorporate the resonant circuit of any embodiment of the first and second aspect, resulting in improved microcoil NMR devices that provide, for example, improved SNR and line width performance, and thus greatly improved detection capabilities.

In one embodiment of the third and fourth aspects of the invention, the detection device further comprises an NMR imaging system. Such imaging systems are known to those of skill in the art. In another embodiment of the third and fourth aspects of the invention, the detection device further comprises a matching capacitor in electrical connection to the resonant circuit, which connects the resonant circuit to the detection electronics of the device (ie: the NMR detection system). In a further embodiment of the third and fourth aspects of the invention, the detection device further comprises fluid handling tubing in fluid communication with the capillary. Such fluid handling tubing facilitates use of the device in detection assays. In a still further embodiment of the third and fourth aspects of the invention, the detection device further comprises one or both of chromatography and capillary electrophoresis devices in fluid communication with the fluid handling tubing; as will be apparent to those of skill in the art, such further devices expand the range of assays that the detection device can handle. Each of these embodiments can be used in combination with other embodiments of the third and fourth aspects of the invention, as well as further aspects of the invention that involve use of the detection devices of the third and fourth aspects. Details of each of these embodiments are provided in the examples below.

In a fifth aspect, the present invention provides methods for detection comprising:
 (a) delivering a sample fluid to a detection system according to any embodiment of the third or fourth aspects of the invention;
 (b) resonating the resonant circuit at low frequency; and
 (c) detecting resonance signals from the sample, wherein the resonance signals correlate with a presence of one or more targets of interest in the sample fluid.

The detection methods of the invention can be used to detect any entity of interest, such as cells. The use of the resonant circuits and detection devices of the invention provide greatly improved detection capabilities, for example, via improved SNR and line width performance. Any embodiment of the first, second, third, or fourth aspects of the invention can be used in the methods of the invention. Details of the detection methods are provided in the examples that follow. "Low" frequency is the frequency appropriate for detecting the desired resonance in the magnetic field of the magnet chosen for the device.

In a sixth aspect, the present invention provides methods for designing an auxiliary tuning inductor for use in an NMR microcoil resonant circuit, comprising:
 (a) preparing a microcoil with wire of a first diameter;
 (b) determining an RF resistance of the microcoil;
 (c) winding an auxiliary inductor coil with wire of a second diameter, where the second diameter is greater than the first diameter, and wherein a radius of the auxiliary inductor coil is determined using the formula:

$$r_{coil} = \sqrt{\frac{25 l_{wire} k d_{wire}}{46\pi}}$$

where $l_{wire}$ is the wire length, $d_{wire}$ is the wire diameter, and $kd_{wire}$ is the turn-to-turn wire spacing.

As described in detail below, appropriate auxiliary tuning inductor design insures that the auxiliary tuning inductor does not degrade the SNR performance of the microcoil. Thus, the methods of this sixth aspect of the invention are of value in designing and constructing the resonant circuits and detection devices of the invention, as well as improving their usefulness in detection assays.

In a seventh aspect, the present invention provides methods for forming a closely wound microcoil, comprising:
 (a) mounting a microcapillary tube to a headstock of a miniature lathe via an optical fiber chuck appropriately sized to hold a microcapillary tube;
 (b) attaching a first end of a wire to the optical fiber chuck;
 (c) attaching a second end of the wire to a support controlled by a saddle and cross-feed of the miniature lathe; and (d) turning the headstock and repositioning the cross-feed of the lathe until close winding of the microcoil around the microcapillary tube is complete.

As will be understood by those of skill in the art, such coil winding methods can be manual or automated.

The methods of this seventh aspect of the invention can be used, for example, to produce closely wound microcoils for use in the resonant circuits of the invention. Details of this aspect of the invention are provided in the examples that follow.

EXAMPLES

Construction Methods

Winding coils-As our goal is to construct small portable NMR systems at reasonable cost, we seek a method for manufacturing microcoils that is significantly simpler than the focused ion beam techniques used to construct the coil for our first experiments. The classic coil construction method is "hand-winding" using standard (usually enameled) wires. A simple gear-synchronized device for accurately winding very small coils on pulled pipette tips has been previously described [17]. The main requirements of any such device are methods for holding the sample tube and rotating it and for controlling the position of the very fine wire as it is taken up on the tube. We find that these requirements are readily met through the use of a miniature lathe [Taig Tools, Chandler, Ariz.] in conjunction with optical fiber chucks [Newport] appropriately sized to hold micro-capillary tubes [Vitrocom]. The tube is mounted to the headstock of the lathe using the fiber chuck. One end of the wire is taped to the fiber chuck while the other is taped to a support whose position is controlled by the saddle and cross-feed of the lathe. A 7×-30× dissecting microscope is used to visually monitor the coils as they are wound by gradually turning the headstock and repositioning the cross-feed of the lathe by hand. The capillary tubes are very flexible, and their deflection while winding aids in maintaining the proper tension on the wires [typically 50 gauge enameled copper, California Fine Wire]. When finished, the coil is secured to the tube using standard five-minute epoxy. With minimal practice, coils can be wound in about 15 minutes.

One key to this rapid coil construction lies in our choice to close-wind our coils. Generally, NMR practitioners assume that coils should be wound with some space between the turns [25,27] in order to avoid strong proximity effects that can increase the high-frequency resistance of the coil windings, leading to excess electrical noise. However, we are operating our coils at rather low frequencies, low enough that the diameter of our wire is only about 2.5 times larger than the radio frequency (RF) skin depth. Furthermore, the enamel layer on our wire is about 6 µm thick, yielding a measured 37 µm turn-to-turn spacing. (The diameter of 50 gauge bare copper wire is 25 µm.) Under these conditions, the RF resistance is enhanced over the DC resistance by 4% due to the skin effect and only an additional 4-11% due to the proximity effect [1]. On the other hand, a close-wound coil has the highest possible pitch and hence the highest signal detection sensitivity. The high performance of close-wound micro-coils has been demonstrated experimentally [17]; the SNR was found to be maximal for minimal turn spacing. However, as discussed above, this practice has been discouraged by NMR practitioners as leading to strong proximity effects that ultimately lead to excess noise [25, 27]. One practical benefit of close winding is that it greatly reduces the need to accurately control the wire during coil construction.

Designing the probe circuit—In our earlier work with microcoils, we introduced the counterintuitive idea of using a large, fixed-value auxiliary inductor in the resonant circuit of the probe. While not strictly necessary for the "large" (550 µm diameter) coil in our earlier work, such an auxiliary inductor is a practical necessity for smaller coils operating at low frequency. There are at least two benefits of the auxiliary inductor. Very small sample coils cannot be resonated at the low operating frequencies typical of permanent magnet based NMR devices without the use of very high capacitances. Either a physically large variable capacitor (contrary to the goal of miniaturization) or a large amount of fixed capacitance in parallel with a variable capacitor (which reduces the tuning range, awkward given the field drifts of permanent magnets) would be required. Furthermore, it is difficult to construct a resonant circuit for a microcoil without introducing paths for circulating currents whose inductances are larger than the branch of the circuit that contains the microcoil. This is especially true for circuits that contain more than one tuning capacitor in parallel. Under such conditions, the circuit as a whole may resonate at the desired frequency, but the current paths in this resonant mode will largely avoid the branch of the circuit containing the sample coil. An auxiliary inductor, placed in series with the microcoil, both forces the resonant current to flow through the sample coil and reduces the need to include numerous capacitors and their multiple, competing current paths.

The auxiliary inductor raises the Q of the probe circuit. For high resistance microcoils, the resulting Q is still modest (~10-20), rendering the electrical resonance easy to detect without presenting difficulties with respect to probe stability or excessive ring-down.

Proper design of the auxiliary inductor insures that it does not degrade the SNR performance of the probe over what theoretically could be achieved without the auxiliary inductor. One key idea is that the auxiliary inductor should not contribute to the resistance of the resonant circuit. It is stray resistance that degrades the performance of NMR circuits, not stray inductance. [27] Once the microcoil has been wound, its RF resistance can be measured or calculated, and this value serves as the starting point for auxiliary inductor design. Ideally, the RF resistance of the auxiliary inductor should be much less than that of the microcoil. If the inductor adds 10% to the circuit's RF resistance, the SNR will be reduced by 5%. To minimize its resistance, the auxiliary inductor is wound using large diameter wire. For our probes, we typically choose 14 gauge copper wire (diameter=1.63 mm). Given that the current will be carried only at the outer surface of the wire, we can calculate the longest piece of such wire consistent with our goal of low resistance. It can be shown that the maximal inductance that can be constructed from a wire of length $l_{wire}$ is achieved with a coil of radius:

$$r_{coil} = \sqrt{\frac{25 l_{wire} k d_{wire}}{46\pi}} \quad (1)$$

where $d_{wire}$ is the wire diameter, and $kd_{wire}$ is the turn-to-turn spacing (k=1.3, typically). Our microcoils have RF resistances that are typically 0.2-1.0Ω at our operating frequency (44 MHz), and the calculated auxiliary inductors are conveniently sized (radius 0.3-0.6 cm, 2-4 turns).

Figure 1A:
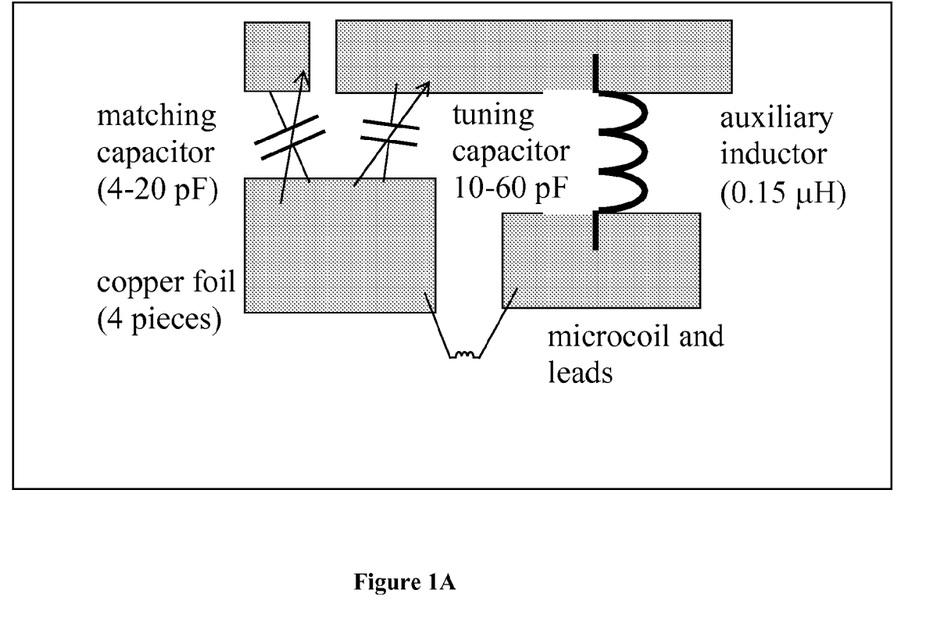
FIG. 1. The microcoil probe module. The top panel is a schematic arranged in the same way as the actual circuit. The bottom panel shows the circuit as mounted on an acrylic block. The microcoil itself is in the lower middle of the picture, centered over a round hole in the acrylic. The capillary tube (330 μm OD, 200 μm ID) is glued into the two sections of flexible tubing which exit the picture to the right and left, and are glued to the acrylic block. The three turn auxiliary inductor is at the upper right. The two round objects with crosses at their centers are the matching and tuning capacitors, respectively.
Figure 1B:
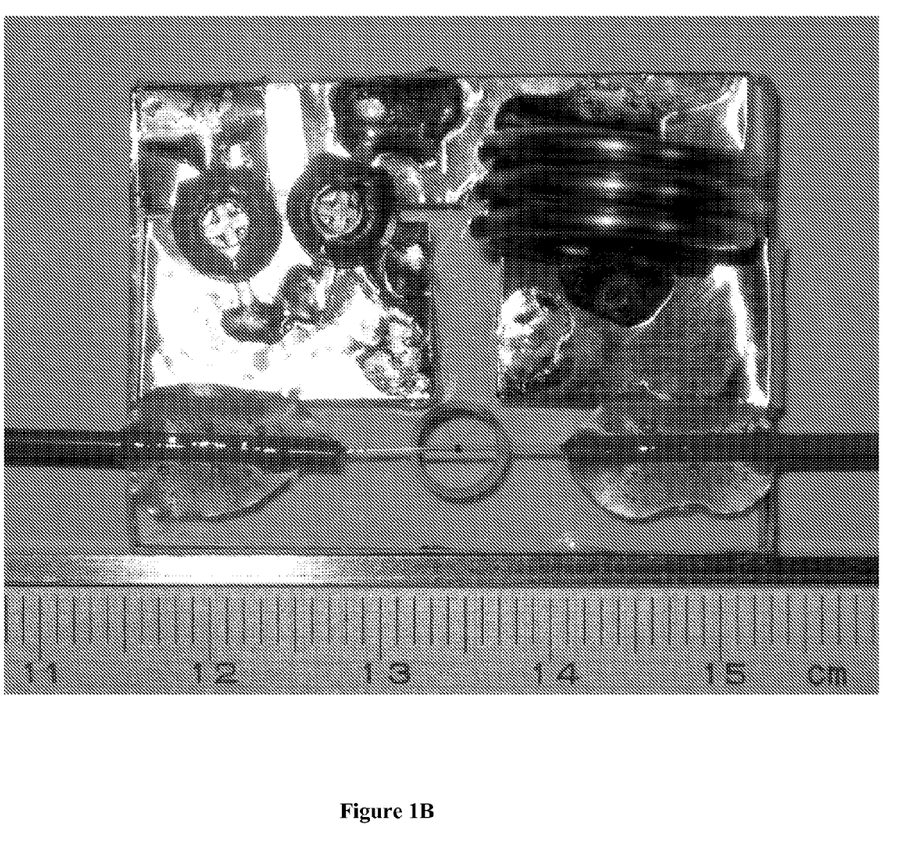

With the auxiliary inductor properly constructed, we build the remainder of our NMR probe circuit. For example, a small rectangle of acrylic sheet (roughly 4 cm×3 cm×0.7 cm) can serve as a mechanical support. Small pieces of adhesivebacked copper foil are cut and placed on the acrylic block so that the sample coil, auxiliary inductor, and tuning and matching capacitors can all be mounted on the block. The capillary tube on which the sample coil is wound is glued into two lengths of flexible tubing (we have used PEEK and Radel) using standard five-minute epoxy. This structure is in turn glued to the acrylic block so that the fragile capillary tube is isolated from mechanical shocks transmitted along the flexible tubing. The auxiliary inductor and capacitors are soldered to the copper foil, and the acrylic-block-mounted module is then installed in a shielded probe body (we have used cast aluminum boxes, or plastic boxes covered with copper foil). A photograph of one of the detector modules is shown in FIG. 1. As we show below, these very simple and crude probe construction techniques yield NMR detectors that achieve optimal performance.

Results

Using the methods described above, we have wound a series of microcoils of different sizes, as detailed in Table 1.

TABLE 1

Microcoil probe parameters.

| Capillary OD/ID (μm) | Turns | Length (μm) | Calculated inductance (nH) | Sample diameter (μm) | Sample volume (nL) |
|---|---|---|---|---|---|
| 170/100 | 4 | 148 | 3 | 100 | 1.2 |
| 250/150 | 5 | 185 | 7 | 150 | 3.3 |
| 330/200 | 6 | 222 | 13 | 200 | 7.0 |
| 550/400 | 17.5 | 648 | 120 | 400 | 81 |

We designate the capillary size with two numbers, the outer diameter and inner diameter of the tube, in micrometers. The length of the coil is calculated from the number of turns and measured total wire diameter of 37 μm. The inductance is calculated using the standard formula. [25] The three smallest coils were built into probe circuits that contained an auxiliary inductor: 3 turns of 14 gauge bare copper wire with a 14.5 mm diameter (calculated inductance 150 nH). The probe circuit for the largest coil did not employ an auxiliary inductor.

Figure 2:
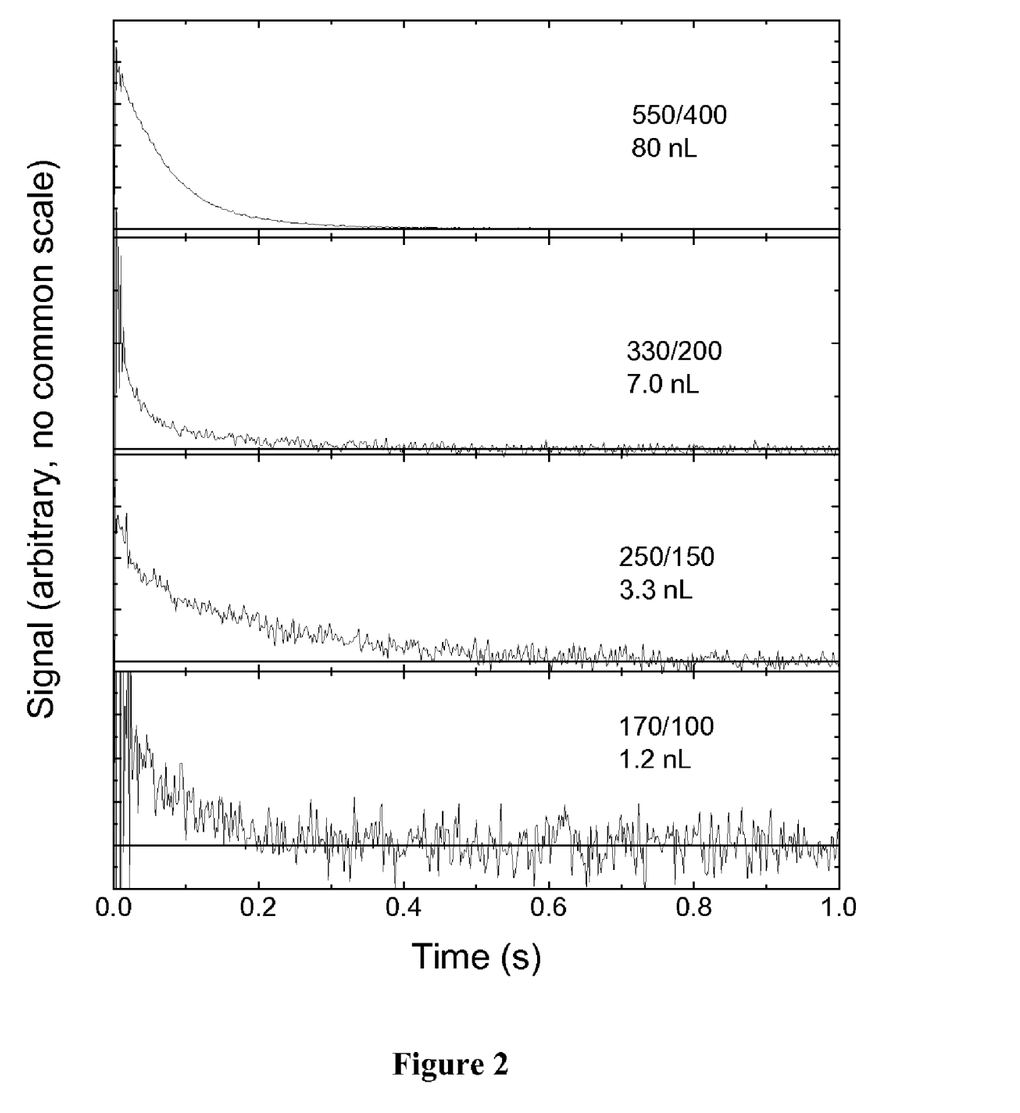
FIG. 2. Single-shot FIDs from each of the four microcoil probes described in Table 1. The complex time domain data were frequency- and phase-shifted so that all of the signal appears in the real-part of the data set, which is plotted here. The zero of the vertical axis is indicated by the horizontal line in each panel. The receiver bandwidth was ±250 Hz for all probes. The SNR value was determined from the extrapolation of the signal to zero time and the rms value of the variations in the baseline.

To determine the SNR, we performed a single-pulse experiment and acquired a single two-channel free induction decay (FID) signal. For all of our experiments, we used a 1.04 Tesla permanent magnet with a 5 cm clear gap equipped with linear gradient/shim coils. This is hardly a portable magnet; however it has the same field as our 0.6 kg 1 Tesla magnet, and the much larger gap facilitates rapid detector prototyping. The NMR console was a compact imaging system from MRTechnology (Japan). The sample fluid was Magnevist(Gd)-doped water ($T_1$~430 ms) delivered by syringe though the tubing attached to the capillary. To determine the SNR, the detected signal was corrected for baseline offset and then mathematically adjusted to be on resonance with all of the signal power in one of the channels. The resulting "on-resonance" FIDs are shown in FIG. 2.

TABLE 2

Measured performance and resistance of microcoils.

| Probe | Observed SNR (±10%) | Detector bandwidth (Hertz) | Line width (Hertz) (±10%) | Resistance (Ω) (±0.01 Ω) | Power (μW) (±15%) |
|---|---|---|---|---|---|
| 170/100 | 8.6 | ±250 | 1.5 | 0.43 | 7.6 |
| 250/150 | 38 | ±250 | 1.5 | 0.44 | 14 |
| 330/200 | 63.5 | ±250 | 2.8 | 0.57 | 20 |
| 550/400 | 485 | ±250 | 5 | 1.61 | 25 |

The noise value was taken to be the standard deviation of the data in the baseline region, the last 50% or so of the data set. The signal was determined by extrapolating the FID back to zero time. Extrapolation was necessary because our narrow bandwidth filters ring for a significant time after the RF pulse. (Our console, designed for imaging, is not optimized for operation at our narrow bandwidths and is not equipped with a adjustable receiver muting circuit.) The measured SNR values are given in Table 2 and have an estimated uncertainty of 10%, which comes from both the extrapolation and from the uncertainty in the standard deviation of the baseline data.

Figure 3:
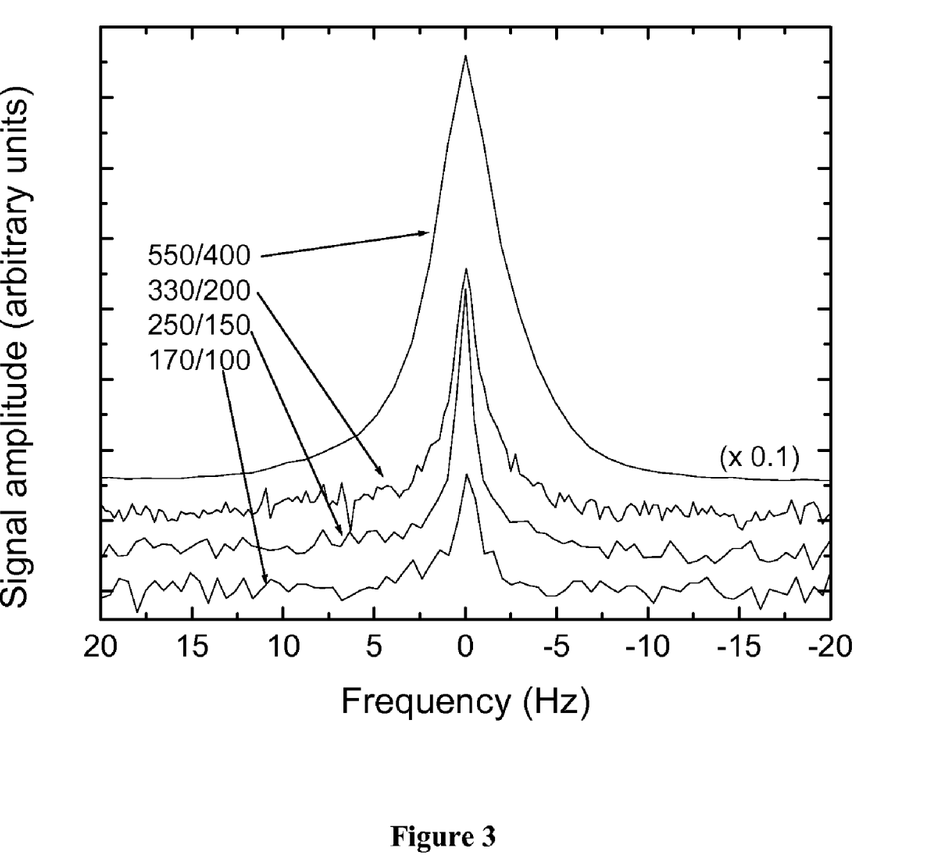
FIG. 3. The best line shapes observed in each of the four microcoil probes described in Table 1. The spectra shown are the Fourier Transforms of single FIDs (i.e., no signal averaging). These were not the same FIDs as shown in FIG. 2. To avoid the influence of distortions of the early-time data due to filter ringing, the FIDs were time shifted before transformation. No zero-filling or apodization methods were applied. The resonance frequency was 44.4 MHz. (The spectrum for the 330/200 probe has higher resolution because twice as many data points were acquired for this probe, giving a two-fold increase in the length of the data acquisition window.)

The minimum achieved line width (FWHM of a Lorentzian fit to the Fourier Transform of FID data) is also given in Table 2. The probe was carefully positioned in the most homogeneous location in the magnet, and the linear shims were adjusted to maximize the lifetime of the FID (and optimize its shape). The shims typically provided a 2-5 fold reduction in the line width. The line widths reported in Table 2 are the narrowest we achieved, and the resonance peaks are displayed in FIG. 3. Typically, careful placement of each probe into the same position in the magnet allowed the line width to be reproduced to within 20%. Note that the FID data used to determine minimum line widths were not the same as those used to determine maximum SNR.

TABLE 3

Calculated resistance and SNR performance of microcoil probes.

| Capillary | $R_{DC}$ (Ω) | Skin depth factor | Proximity factor | $R_{RF}$ (Ω) | Auxiliary inductor (Ω) | Total (Ω) | Calculated SNR |
|---|---|---|---|---|---|---|---|
| 170/100 | 0.43 | 0.040 | 0.039 | 0.45 | 0.047 | 0.50 | 13 |
| 250/150 | 0.44 | 0.040 | 0.044 | 0.47 | 0.047 | 0.52 | 36 |
| 330/200 | 0.57 | 0.040 | 0.050 | 0.61 | 0.047 | 0.66 | 67 |
| 550/400 | 1.61 | 0.040 | 0.114 | 1.82 | none | 1.82 | 474 |

The DC resistance of the microcoils, given in Table 2, was measured with a benchtop DMM (Fluke 8840A/AF) operating in two-wire mode. The resistance of the microcoil together with the leads connecting it to the rest of the probe circuit was measured. The DMM lead resistance of 0.040±0.005Ω was subtracted from the measured values, which have an overall uncertainty of about 0.01Ω. The rightmost column in Table 2 gives the RF power required to produce the 100 μs π/2 pulse in our experiments. This power was determined by measuring the peak-to-peak voltage of the pulse seen by the probe circuit by routing this pulse to a 50 Ω-terminated oscilloscope. The uncertainty in the measurement comes from the roughly ±10% uncertainty of reading the oscilloscope screen.

Discussion

Comparison to original microcoil results—We have achieved an SNR of 485±50 with the 50 gauge wire-wound 550/400 microcoil using a detection bandwidth of ±250 Hz. To facilitate comparison to our previous focused ion beam (FIB) coil result, we re-analyzed the previous data using the method described above. (Henceforth, we refer to this coil as the "FIB-coil.") The re-analyzed SNR value for the FIB-coil was 38±2 in a detection bandwidth of ±5000 Hz. At this bandwidth, our wire-wound coil should give an SNR of 108±12. To account for the different lengths of the sample volumes, we note that extending our wire-wound coil to the 2.1 mm length of the FIB-coil would enclose 3.24 time more volume while increasing the resistance by the same factor. We therefore scale the SNR by $\sqrt{3.24}$ and calculate that a wire wound coil of the same size as the FIB-coil should yield an SNR of 194±20. Hence, the wire-wound coil achieved a 5-fold (5.1±0.8) improvement in SNR performance over the FIB-coil. The DC resistances of a wire-wound coil that is the same length as the FIB-coil would be 5.22Ω, compared with the 5.42Ω of the FIB coil. The pitch of the wire-wound coil is two times finer than the FIB-coil. These two differences account for a factor of two improvement in the SNR. The FIB-coil's probe circuit contained other sources of resistive losses, including the 45 cm quarterwave cable and the long (10 cm) leads between components in the two shielded boxes. These resistances are eliminated in the present design, which helps account for the observed 5-fold improvement in SNR.

The line width achieved in the wire-wound 550/400 probe was 115 ppb, a factor of 2 worse than our FIB-coil result. In our previous paper [26], we speculated that the narrow line had been achieved due to the high cylindrical symmetry of the FIB-coil. Due to the following experiments, we now believe that the main reason was the relative lack of metal present in that coil.

Before winding the 550/400 coil described in Table 1, we wound a 20-turn coil with 40-gauge enameled copper wire on a 550/400 tube. This coil was 1.5 mm long and contained a sample volume of about 190 nL. The turn-turn spacing was ~80 microns, nearly the same as the FIB-coil, while the volume was about ¾ of the FIB-coil's sample volume. However, the narrowest line achieved in this 40-gauge probe was 1 ppm, nearly 20 times worse than the FIB-coil. Since a narrower line had been achieved over a larger sample volume in the FIB-coil, homogeneity of the background magnetic field could be ruled out as a factor limiting the line width. A series of modifications were made to this 40-gauge probe in order to ascertain the source of the excess line broadening. Guided by the original FIB-coil probe, in which no piece of the probe circuitry or support structure came within 3 mm of the sample volume, new versions of the 40-gauge probe were constructed in which the support structures, electrical circuitry, and fluid handling tubing were all moved well away from the sample volume; no improvement in the line width was observed. The final modification was to replace the 40-gauge with 50-gauge wire. This 50-gauge coil achieved the much smaller line width given in Table 2.

The 550/400 coil wound with 50-gauge wire yielded a line width a factor of 2 worse than our original FIB-coil result, while the 40-gauge coil was a factor of 10 worse than the 50-gauge coil. These line width differences correlate very well with the cross-sectional areas of the wires in each of the these coils, 4900 $\mu m^2$, 490 $\mu m^2$, and 325 $\mu m^2$ for the 40-gauge, 50-gauge, and FIB-coils, respectively. (The wire-wound coils were copper. The FIB coil was gold, 3 times more diamagnetic than copper, over a very thin chromium layer, which would compensate for the gold to some extent.) Due to the skin-depth effect, only the outer surface of the 40-gauge wire (an effective area of 250 $\mu m^2$) carries current, so most of the copper in that wire is "wasted." This excess copper, although it would not affect the SNR performance of the coil [Peck1995][1], affects the homogeneity of the field in the sample volume. It appears that the presence of copper near the sample volume should be minimized in order to achieve the highest resolution, indicating that wires much larger than the skin depth should be avoided. Of course, susceptibility matching techniques [3,6] may be employed to overcome the distortions of the field due to the wires, but these would complicate our device.

Performance of smaller coils—As shown in Table 2, the resolution achieved in the three smallest coils is extremely good, approaching 30 ppb using only linear shims. Furthermore, the SNR is high enough that the FID is visible in a single shot, even in the smallest coil's ~1 nL volume. It is clear that our probe circuit design and simple, fast, inexpensive construction methods produce useable NMR detectors. However, we may ask if these detectors are performing optimally.

The SNR value we expect from these coils and probe circuits can be calculated using [1]

$$SNR = \frac{k_0(B_1/i)v_s N\gamma\hbar^2 I(I+1)\omega_0^2/3\sqrt{2}\,k_B T}{\sqrt{4k_b TR\Delta f}} \quad (2)$$

where $k_0$ is a constant that accounts for geometric effects associated with irregularity of the $B_1$ field produced by the finite solenoid as well as non-uniform excitation of the spins in the sample volume. ($B_1/i$) is the efficiency of the coil in generating $B_1$, and for a solenoid it has the value $\mu_0 n$, where $\mu_0 = 4\pi \times 10^{-7}$ Tm/A and n is the turns per unit length. $v_s$ is the sample volume, $N=6.7 \times 10^{28}/m^3$ the number density of hydrogen nuclei in our water samples, $\gamma=2.675 \times 10^8$ radians/sec/T is the gyromagnetic ratio for hydrogen nuclei, $I=\frac{1}{2}$ for hydrogen, $\omega_0=2.78 \times 10^8$ radians/s for hydrogen nuclei in our field, T=297K, R the high frequency resistance of the LC resonant circuit, and $\Delta f$ the detection bandwidth. $k_0$ is the only parameter that cannot be measured or calculated easily. It should have a value close to but slightly less than 1.0, and should not differ substantially for our probes because they all have similar coil and sample geometries. We set $k_0$=1.0 in our calculations. Our detectors differ mainly in their sample volumes and resistances.

Figure 4:
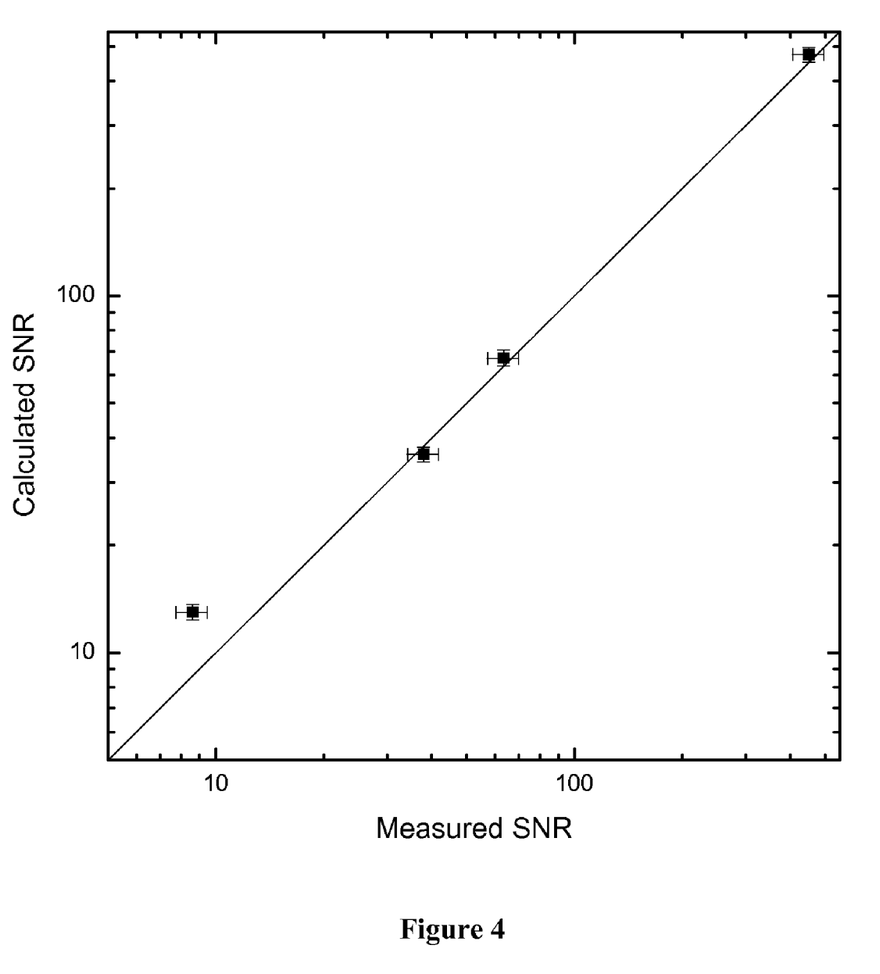
FIG. 4. Calculated SNR versus measured SNR. The calculations were made using Eq. (2) and setting the one unknown parameter, $k_0$ to unity. The uncertainties in the calculated values come from the 10% uncertainties in the measured DC resistances upon which the calculations are based. The uncertainties in the measured values are estimated from the uncertainty of the extrapolation of the FID data to zero time and the uncertainty in the rms value of the baseline.

To calculate the expected SNR, we need to know the RF resistances of each element of the LC resonant circuit. The other parts of the probe, including the matching capacitor, the connections to ground, etc., play a much smaller role in contributing to losses in the circuit because the currents flowing in these sections of the probe are much smaller than in the resonant loop itself. We can calculate the resistances for each element of the resonant circuit by measuring their physical dimensions and considering that current will only flow in the region within a skin depth (10 $\mu m$ in copper at our frequency) of the surface. For the 50-gauge wire, we measure the DC resistance of the microcoil and its leads; this value is given in Table 2 and repeated in the $2^{nd}$ column of Table 3 for convenience. We convert this DC resistance to a calculated RF resistance by using Tables 2 and 4 in Peck, et al., [1]. The RF resistance of the leads is raised by the skin depth effect, the strength of which may be found using Table 2 of Peck, et al. The factional enhancement to the DC resistance is about 4% for our coils, as shown in the third column of our Table 3. For the wires in a coil, the proximity effect also plays a role. The strength of the proximity effect depends on the number of turns and the coil aspect ratio, and can be calculated using FIGS. 2 and 4 in Peck, et al. The $4^{th}$ column in our Table 3 gives the fractional enhancement to the DC resistance due to the proximity effect in each of our coils. The $5^{th}$ column in our table is the total RF resistance, calculated by applying the enhancement factors to the measured DC resistance, with the proximity effect applied only to the fraction of the wire length in the microcoils. The calculated RF resistance of the auxiliary inductor is given in the $6^{th}$ column, and the total RF resistance of the LC circuit is given in the $7^{th}$. We find that the copper foil and the tuning capacitors contribute negligibly to the resistive losses.

One is faced with a number of definitional questions in linking measurements of absolute SNR to the theory [28,29]. Johnson's measurements were single-channel incoherent measurements of sub-megahertz voltage signals. Our NMR spectrometer processes the signal from the NMR coil to yield two channels of voltage data, each derived from a coherent combining of the NMR voltage signal with a local oscillator. In order to make the most direct connection with the older measurements, we process our two-channel signals by frequency- and phase-shifting them so that the entire signal appears in one of the channels. From this point forward, we treat this single channel as our entire signal, measuring the signal level from its amplitude at zero time and calculating the noise as the standard deviation of the values in the baseline, as described earlier.

A second consideration applies to the definition of the bandwidth $\Delta f$. In Nyquist's treatment, the rms voltage noise is white (that is, it has equal powers in every frequency interval $\Delta f$). The number 4 in the denominator of Eq. 2 is appropriate for an ideal filter that passes (without any weighting) only frequencies within the bandwidth $\Delta f$ and excludes all others. A single pole filter, with its Lorentzian transfer function, will admit more noise, and the factor 4 should be multiplied by $\pi/2$, assuming that $\Delta f$ represents the FWHM of the Lorentzian. Our filters are eighth order, so they closely approximate the ideal filter.

The calculated SNR values in Table 3 agree very well with the measured values in Table 2, indicating that we accurately accounted for the losses in the probe circuit. A graphical comparison is provided in FIG. 4.

It is also possible to relate the SNR performance of the system to its characteristics in transmit mode. [27] If the current i that gives rise to $B_l$ flows through the resistance R responsible for the loss, then the power dissipated is $P=iR^2$ and Eq. (2) may be recast in the form:

$$P = \left(\frac{A v_s B_1}{SNR}\right)^2 \quad (3)$$

with $A=2.31\times10^{14}$ watt$^{1/2}$ m$^{-3}$ T$^{-1}$ (for $k_0=1$, $\Delta f=500$ Hz). A 100 μs $\pi/2$ pulse corresponds to $B_l=0.59$ G=$5.9\times10^{-5}$ T. Using Eq. (3), the sample volumes $v_s$ from Table 1, and the measured SNR values from Table 2, we calculate expected RF power requirements of 9.1 μW, 14 μW, 23 μW, and 52 μW for our four probes. The agreement with the measured values given in Table 2 is within uncertainties for the three smallest coils. Hence, the SNR measurements are consistent with the transmit performance of the probe, indicating that the SNR values are not corrupted by excess noise in our receiver. For the largest coil, the agreement is not quite as good, even when the uncertainties in the measured SNR and power are taken into account. We do not currently have a detailed explanation for this, except to note that the largest coil is substantially larger than the others and has a correspondingly much higher SNR.

Table 3 shows that our auxiliary inductor does not decrease the SNR performance unacceptably. We see that in the probes tested, the auxiliary inductor accounts for about 10% of the resistive losses, leading to a 5% decrease in the SNR that might be achieved without it. Removing the inductor therefore will not make a very large improvement in the SNR performance of these probes. However, without the auxiliary inductor, the probe circuit will be much more difficult to construct and operate.

Building and testing a better probe—The agreement between the observed and calculated SNR in our first set of probes indicates that we have a good quantitative understanding of the factors contributing to the SNR performance. We now ask if we can improve the SNR.

This is equivalent to asking if there are stray resistances that can be removed. The first set of coils had rather long connections between the microcoils themselves and the remainder of the probe circuit, in order to avoid the homogeneity-degrading effects of large conductors too near the sample. Since these connections are made with the narrow gauge wire, they contribute substantially to the resistance (and hence noise) in our detector, without contributing signal. We have measured the lead lengths of our coils and then used the results of Peck, et al. [1] to calculate the separate contributions of the microcoils and the leads to the resistance of the LC circuit. The values are given in the $2^{nd}$ and $3^{rd}$ columns of Table 4. The $4^{th}$ column gives the total calculated RF resistance of the coil and its leads, while the $5^{th}$ column gives the value of this same quantity that we calculated based on the measured DC resistance (see Table 3). The last column gives the calculated RF resistance of the auxiliary inductor, also from Table 3.

TABLE 4

Contributions to the resistive losses in the microcoil probe circuits.

| Capillary | Microcoil (Ω) | Leads (Ω) | Total (Ω) | "Measured" Total (Ω) | Auxiliary inductor (Ω) |
|---|---|---|---|---|---|
| 170/100 | 0.097 | 0.35 | 0.44 | 0.45 | 0.047 |
| 250/150 | 0.17 | 0.22 | 0.39 | 0.47 | 0.047 |
| 330/200 | 0.26 | 0.29 | 0.55 | 0.61 | 0.047 |
| 550/400 | 1.29 | 0.31 | 1.60 | 1.82 | none |

Table 4 indicates that probes with shorter leads can achieve higher SNR performance. Shortening the leads requires bringing larger conductors closer to the sample volume. Given our experience with the 40 gauge wire and the 550/400 coil, we expect that the resolution will eventually be degraded as larger amounts of copper are placed closer to the sample volume. A compromise between resolution and SNR, informed by the requirements of the measurements to be performed, will govern the optimization of the probe circuit design.

Conclusions

We have shown that very small microcoils can readily be operated as NMR detectors in the low magnetic fields of permanent magnets, a new size and frequency regime for miniaturized NMR detectors. The close agreement in the measured SNR and the values calculated based on a detailed analysis of the sources of resistive losses in our NMR probes indicate that the simple construction methods we employ yield outstanding probes. In particular, the SNR performance confirms that the auxiliary "tuning" inductor does not degrade SNR performance. The detailed analysis of the resistive losses also points the way toward available improvements in SNR performance: reduction of the leads connecting the microcoil to the remainder of the probe circuit. However, reduction of these lead lengths must respect the fact that bringing more metal closer to the sample volume can readily degrade the field homogeneity.

REFERENCES SITED

[1] T. L. Peck, R. L. Magin, and P. C. Lauterbur, "Design and Analysis of Microcoils for NMR Microscopy," J. Magn. Reson. B 108, 114-124 (1995).

[2] D. L. Olsen, T. L. Peck, A. G. Webb, R. L. Magin, and J. V. Sweedler, "High-resolution microcoil $^1$H-NMR for mass-limited, nanoliter-volume samples," *Science*, 270, 1967 (1995).

[3] A. G. Webb and S. C. Grant, "Signal-to-Noise and Magnetic Susceptibility Trade-offs in Solenoidal Microcoils for NMR," J. Magn. Reson., B 113, 83-87 (1996).
[4] J. A. Rogers, R. J. Jackman, G. M. Whitesides, D. L. Olson, and J. V. Sweedler, "Using microcontact printing to fabricate microcoils on capillaries for high resolution proton nuclear magnetic resonance on nanoliter volumes," Appl. Phys. Lett., 70, 2464-2466 (1997).
[5] J. E. Stocker, T. L. Peck, A. G. Webb, MFeng, R. L. Magin, "Nanoliter Volume, High-Resolution NMR Microspectroscopy Using a 60-um Planer Microcoil", IEEE Trans. Biomed. Eng. 44, 1122-1127 (1997).
[6] B. Behnia and A. G. Webb, "Limited-Sample NMR Using Solenoidal Microcoils, Perfluorocarbon Plugs, and Capillary Spinning," Anal Chem., 70, 5326-5331 (1998).
[7] R. Subramanian, M. M. Lam, and A. G. Webb, "RF Microcoil Design for Practical NMR of Mass-Limited Samples," J. Magn. Reson. 133, 227-231 (1998).
[8] D. L. Olson, M. E. Lacey, and J. V. Sweedler, "High-resolution microcoil NMR for analysis of mass-limited, nanoliter samples," Analytical Chem., vol. 70, pp. 645-650, 1998.
[9] V. Malba, R. Maxwell, L. B. Evans, A. F. Bernhardt, M Cosman, and K. Yan, "Laser-lathe Lithography—A Novel Method for Manufacturing Nuclear Magnetic Resonance Microcoils," Biomed. Microdev., 5, 21-27 (2003).
[10] D. Djukovic, S. Liu, I. Henry, B. Tobias, and D. Rafferty, "Signal Enhancement in HPLC/Microcoil NMR Using Automated Column Trapping," Anal. Chem., 78, 7154-7160 (2006).
[11] N. Wu, T. L. Peck, A. G. Webb, R. L. Magin, and J. V. Sweedler, "$^1$H-NMR Spectroscopy on the Nanoliter Scale for Static and On-Line Measurements," Anal. Chem. 66, 3849 (1994).
[12] J. D. Trumbull, I. K. Glasgow, D. J. Beebe, and R. L. Magin, IEEE Trans. Biomed. Eng. 47, 3 (2000).
[13] C. Massin, F. Vincent, A. Homsy, K. Ehrmann, G. Boero, P.-A. Besse, A. Daridon, E. Verpoorte, N. F. de Rooij, and R. S. Popovic, "Planar microcoil-based microfluidic NMR probes," J. Magn. Reson., 164, 242-255 (2003).
[14] B. Sorli, J. F. Chateaux, M. Pitaval, H. Chahboune, B. Favre, A. Briguet, and P. Morin, "Micro-spectrometer for NMR: analysis of small quantities in vitro," Meas. Sci. Technol,. 15, 877-880 (2004).
[15] D. A. Seeber, J. H. Hoftiezer, W. B. Daniel, M. A. Rutgers, and C. H. Pennington, "Triaxial magnetic field gradient system for microcoil magnetic resonance imaging," Rev. Sci. Inst., 71, 4263-4272 (2000).
[16] S. C. Grant, N. R. Aiken, H. D. Plant, S. Gibbs, T. H. Mareci, A. G. Webb, and S. J. Blackband, "NMR Spectroscopy of Single Neurons," Magn. Reson. Med., 44, 19-22 (2000).
[17] D. A. Seeber, R. L. Cooper, L. Ciobanu, and C. H. Pennington, "Design and testing of high sensitivity microreceiver coil apparatus for nuclear magnetic resonance and imaging," Rev. Sci. Inst. 72, 2171-2179 (2001).
[18] S. C. Grant, L. A. Murphy, R. L. Magin, and G. Friedman, "Analysis of Multilayer Radio Frequency Microcoils for Nuclear Magnetic Resonance Spectroscopy," IEEE Trans. Magn. 37, 2989-2998 (2001).
[19] L. Ciobanu and C. H. Pennington, "3D micron-scale MRI of single biological cells," Solid State Nucl. Magn. Reson. 25, 138-141 (2004).
[20] H. Wensink, D. C. Hermes, A. van den Berg, "High signal to noise ratio in low-field NMR on a chip: Simulations and experimental results," 17$^{th}$ IEEE MEMS, 407-410 (2004).
[21] G. Moresi and R. L. Magin, "Miniature permanent magnet for table-top NMR," Concept. Magn. Res., 19B, 35-43 (2003).
[22] A. G. Goloshevsky, J. H. Walton, M. V. Shutov, J. S. de Ropp, S. D. Collins, M. J. McCarthy, "Development of low field nuclear magnetic resonance microcoils," Rev. Sci. Inst., 76, 024101 (2005).
[23] A. G. Goloshevsky, J. H. Walton, M. V. Shutov, J. S. de Ropp, "Integration of biaxial planar gradient coils and an RF microcoil for NMR flow imaging," Meas. Sci. Technol., 16, 505-512 (2005).
[24] Halbach K, "Design of permanent multipole magnets with oriented rare earth cobalt material," Nuclear Instrum Methods, 169, 1-10 (1980).
[25] E. Fukushima and S. B. W. Roeder, Experimental Pulse NMR, (New York: Addison-Wesley, 1981).
[26] L. O. Sillerud, A. F. McDowell, N. L. Adolphi, R. E. Serda, D. P. Adams, M. J. Vasile, T. M. Alam, "$^1$H NMR Detection of superparamagnetic nanoparticles at 1 T using a microcoil and novel tuning circuit," J. Magn. Reson., 181, 181-190 (2006).
[27] D. I. Hoult and R. E. Richards, "The Signal-to-Noise Ratio of the Nuclear Magnetic Resonance experiment," J. Magn. Reson. 24, 71-85 (1976).
[28] J. B. Johnson, "Thermal Agitation of Electricity in Conductors," Phys. Rev., 32, 97-109 (1928).
[29] H. Nyquist, "Thermal Agitation of Electric Charge in Conductors," Phys. Rev., 32, 110-113 (1928).

I claim:

1. A detection device, comprising:
    delivering a sample fluid to a detection device, the detection device comprising:
        a permanent magnet possessing a field strength of 1-2 Tesla; and .
        a resonant circuit comprising:
            a closely wound microcoil, wherein the closely wound microcoil is disposed proximate to a magnetic field generated by the permanent magnet, and wherein the closely wound microcoil is an effective magnetic resonance transmitter or receiver;
            an auxiliary inductor coil electrically connected in series to the closely wound microcoil; and
            a tuning capacitor electrically connected to the closely wound microcoil and the auxiliary inductor coil to form a resonant circuit;
        a capillary with an inner diameter of 100 µm to 400 µm, wherein the closely wound microcoil is woulid around the capillary; and
        fluid-delivery tubing in fluid communication with the capillary;
    resonating the resonant circuit at low frequency; and
    detecting resonance signals from the sample fluid, wherein the resonance signals correlate with a presence of at least one target of interest in the sample fluid.

2. A method for detection, comprising:
    delivering a sample fluid to a detection device, the detection device comprising:
        a permanent magnet possessing a field strength of 1-2 Tesla; and
        a resonant circuit comprising:
            a microcoil comprising wire with a diameter less than or equal to 2.5 times a skin depth of the wire material, wherein the microcoil is disposed proximate to a magnetic field generated by the permanent magnet, and wherein the microcoil is an effective magnetic resonance transmitter or receiver;

an auxiliary inductor coil electrically connected in series to the microcoil; and a tuning capacitor electrically connected to the microcoil and the auxiliary inductor coil to form a resonant circuit;

a capillary with an inner diameter of 100 μm to 400 μm, wherein the microcoil is wound around the capillary; and fluid-delivery tubing in fluid communication with the capillary;

resonating the resonant circuit at low frequency; and detecting resonance signals from the sample fluid, wherein the resonance signals correlate with a presence of at least one target ol interest in the sample fluid.

3. A method for designing an auxiliary tuning inductor for use in an NMR microcoil resonant circuit, comprising:

preparing a microcoil with wire of a first diameter;

determining an RF resistance of the microcoil;

winding an auxiliary inductor coil with wire of a second diameter, where the second diameter is greater than the first diameter, and wherein a radius of the auxiliary inductor coil is determined using the formula:

$$r_{coil} = \sqrt{\frac{25 l_{wire} k d_{wire}}{46\pi}}$$

where $l_{wire}$ is the wire length, $d_{wire}$ is the wire diameter, and $kd_{wire}$ is the turn-to-turn wire spacing.

4. A method for forming a closely wound microcoil, comprising:

mounting a microcapillary tube to a headstock of a miniature lathe via an optical fiber chuck appropriately sized to hold a microcapillary tube;

attaching a first end of a wire to the optical fiber chuck;

attaching a second end of the wire to a support controlled by a saddle and cross-feed of the miniature lathe; and turning the headstock and repositioning the cross-feed of the lathe until close winding of the microcoil. around the microcapillary tube is complete.

* * * * *